United States Patent
So (10) Patent No.: US 8,330,152 B2
(45) Date of Patent: Dec. 11, 2012

(54) OLED DISPLAY ARCHITECTURE WITH IMPROVED APERTURE RATIO

(75) Inventor: Woo-Young So, Richboro, PA (US)

(73) Assignee: Universal Display Corporation, Ewing, NJ (US)

( * ) Notice: Subject to any disclaimer, the term of this patent is extended or adjusted under 35 U.S.C. 154(b) by 181 days.

(21) Appl. No.: 12/954,246

(22) Filed: Nov. 24, 2010

(65) Prior Publication Data

US 2011/0127506 A1 Jun. 2, 2011

Related U.S. Application Data

(60) Provisional application No. 61/283,313, filed on Dec. 2, 2009.

(51) Int. Cl.
*H01L 51/00* (2006.01)
(52) U.S. Cl. .................. 257/40; 257/E51.022
(58) Field of Classification Search .......... 257/40, 257/642, E25.032, E51.022
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 7,091,986 B2 | 8/2006 | Phan |
| 7,279,704 B2 | 10/2007 | Walters et al. |
| 7,431,968 B1 | 10/2008 | Shtein et al. |
| 7,888,860 B2 * | 2/2011 | Sung et al. ............ 313/504 |
| 2003/0230980 A1 | 12/2003 | Forrest et al. |
| 2004/0174116 A1 | 9/2004 | Lu et al. |
| 2005/0258433 A1 | 11/2005 | Djurovich et al. |

(Continued)

FOREIGN PATENT DOCUMENTS

WO   WO 2009/107596   9/2009

OTHER PUBLICATIONS

Baldo et al., "Highly Efficient Phosphorescent Emission from Organic Electroluminescent Devices," Nature, vol. 395, 151-154, 1998.

(Continued)

*Primary Examiner* — Quoc Hoang
(74) *Attorney, Agent, or Firm* — Kilpatrick Townsend & Stockton LLP (57) ABSTRACT

A device such as a display region that includes a plurality of multi-color pixels is provided. Each pixel may have several types of organic light emitting devices that operate as sub-pixels, and at least one type of device may be shared by multiple pixels. Less-used and/or more efficient device types, such as deep blue and green light emitting devices, may be shared between multiple pixels, leading to an improved aperture ratio and fill factor for the device.

22 Claims, 9 Drawing Sheets

U.S. PATENT DOCUMENTS

| | | | |
|---|---|---|---|
| 2005/0260449 | A1 | 11/2005 | Walters et al. |
| 2007/0075627 | A1 | 4/2007 | Kimura et al. |
| 2008/0203905 | A1 | 8/2008 | Je et al. |
| 2008/0224968 | A1 | 9/2008 | Kashiwabara |
| 2009/0051638 | A1 | 2/2009 | Horiuchi et al. |
| 2010/0090620 | A1 | 4/2010 | Hack et al. |
| 2010/0225252 | A1 | 9/2010 | Weaver et al. |
| 2010/0244069 | A1 | 9/2010 | Weaver |

OTHER PUBLICATIONS

Baldo et al., "Very high-efficiency green organic light-emitting devices based on electrophosphorescence," Appl. Phys. Lett., vol. 75, No. 3, 4-6 (1999).

M. S. Weaver, V. Adamovich, B. D'Andrade, B. Ma, R. Kwong, and J. J. Brown, Proceedings of the International Display Manufacturing Conference, pp. 328-331 (2007).

B. D'Andrade, M. S. Weaver, P. B. MacKenzie, H. Yamamoto, J. J. Brown, N. C. Giebink, S. R. Forrest and M. E. Thompson, Society for Information Display Digest of Technical Papers 34, 2, pp. 712-715 (2008).

Jiun-Haw Lee, Yu-Hsuan Ho, Tien-Chin Lin and Chia-Fang Wu, Journal of the Electrochemical Society, 154 (7) J226-J228 (2007).

Franky So, "Organic Electronics: Materials, Processing, Devices and Applications", CRC Press, p. 448-p. 449 (2009).

Masakazu Funahashi et al., Society for Information Display Digest of Technical Papers 47. 3, pp. 709-711 (2008).

Baek-Woon Lee, Young In Hwang, Hae-Yeon Lee and Chi Woo Kim and Young-Gu Ju Society for Information Display Digest of Technical Papers 68.4, pp. 1050-1053 (2008).

A. Arnold, T. K. Hatwar, M. Hettel, P. Kane, M. Miller, M. Murdoch, J. Spindler, S. V. Slyke, Proc. Asia Display (2004).

J. P. Spindler, T. K. Hatwar, M. E. Miller, A. D. Arnold, M. J. Murdoch, P. J. Lane, J. E. Ludwicki and S. V. Slyke, SID 2005 International Symposium Technical Digest 36, 1, pp. 36-39 (2005).

Du-Zen Peng, Hsiang-Lun, Hsu and Ryuji Nishikawa. Information Display 23, 2, pp. 12-18 (2007).

L.D. Silverstein, S.J. Roosendall, and M.J. J. Jak, Journal of the Society for Information Display 14, 3-13 (2006).

The Search Rport and Written Opinion corresponding to the PCT/US2010/058224 application, (filed Nov. 29, 2010).

International application PCT/US10/46218 "Bicarbazole Compounds for OLEDS" filed Aug. 20, 2010.

* cited by examiner

OLED DISPLAY ARCHITECTURE WITH IMPROVED APERTURE RATIO

This application claims priority to U.S. Provisional Patent Application No. 61/283,313, filed Dec. 2, 2009, the disclosure of which is herein expressly incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices, and more specifically to the use of both light and deep blue organic light emitting devices to render color.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for organic emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the structure of Formula I:

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A device that includes a plurality of multi-color pixels is provided. Each pixel may have four sub-pixels, with at least one sub-pixel being shared between multiple pixels.

A device such as a region of a display is provided, which has multiple independently-addressable pixels, each pixel capable of emitting a spectrum. The spectrum each device can emit includes a red component having a peak wavelength in the visible spectrum of 580-700 nm, a green component having a peak wavelength in the visible spectrum of 500-600 nm, a light blue component having a peak wavelength in the visible spectrum of 400-500 nm, and a deep blue component having a peak wavelength in the visible spectrum of 400-500 nm and at least 4 nm less than the peak wavelength of the light blue component. Two of the pixels share at least one organic light emitting device, and at least one of the two includes a first red-emitting organic light emitting device configured to emit light having a peak wavelength in the visible spectrum of 580-700 nm, a first green-emitting organic light emitting device configured to emit light having a peak wavelength in the visible spectrum of 500-600 nm, a first light blue-emitting organic light emitting device configured to emit light having a peak wavelength in the visible spectrum of 400-500 nm, and a first deep blue-emitting organic light emitting device configured to emit light having a peak wavelength in the visible spectrum of 400-500 nm and at least 4 nm less than the peak wavelength of the first light blue organic light emitting device. Each device may emit the corresponding portion of the spectrum that the pixel emits.

The deep blue device may be shared with a second pixel. In such a configuration, the second pixel includes a second red-emitting organic light emitting device configured to emit light having a peak wavelength in the visible spectrum of 580-700 nm, a second green-emitting organic light emitting device configured to emit light having a peak wavelength in the visible spectrum of 500-600 nm, a second light blue-emitting organic light emitting device configured to emit light having a peak wavelength in the visible spectrum of 400-500 nm, the first deep blue-emitting organic light emitting device.

A high-efficiency device, typically the green-emitting device, also may be shared between two pixels. In such a configuration, the second pixel includes a second red-emitting organic light emitting device configured to emit light having a peak wavelength in the visible spectrum of 580-700 nm, the first green-emitting organic light emitting device, a second light blue-emitting organic light emitting device configured to emit light having a peak wavelength in the visible spectrum of 400-500 nm, and the first deep blue-emitting organic light emitting device.

A limited number of device types, typically red, green, light blue, and dark blue, may be used. In configurations where one or more device types are shared between multiple pixels, one or more types make up less than 25%, less than 17%, or less than 15% of the total number of devices in the device or display region. For example, in configurations such as that illustrated in FIG. 7A where deep blue-emitting devices are shared by multiple pixels, the deep blue devices may make up less than about 15% of the total number of devices in a given region of the device. These ratios may apply for an arbitrary region of a display device, for example a region including 100, 1000, or more pixels.

The provided device or display region may be incorporated into various other devices and types of devices, such as consumer products, including full-color displays and devices that include full-color displays.

The use of four sub-pixel configurations as described herein may allow for an enhanced fill factor relative to traditional three sub-pixel devices, especially when a less-used sub-pixel is shared between two or more adjacent pixels. In those configurations, the other sub-pixels may make up a relatively larger portion of each pixel.

Four sub-pixel devices also may achieve longer operations lifetimes by reducing the overall current density within each pixel or display region due to the higher aperture ratio achieved with four sub-pixel devices.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices,"

Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
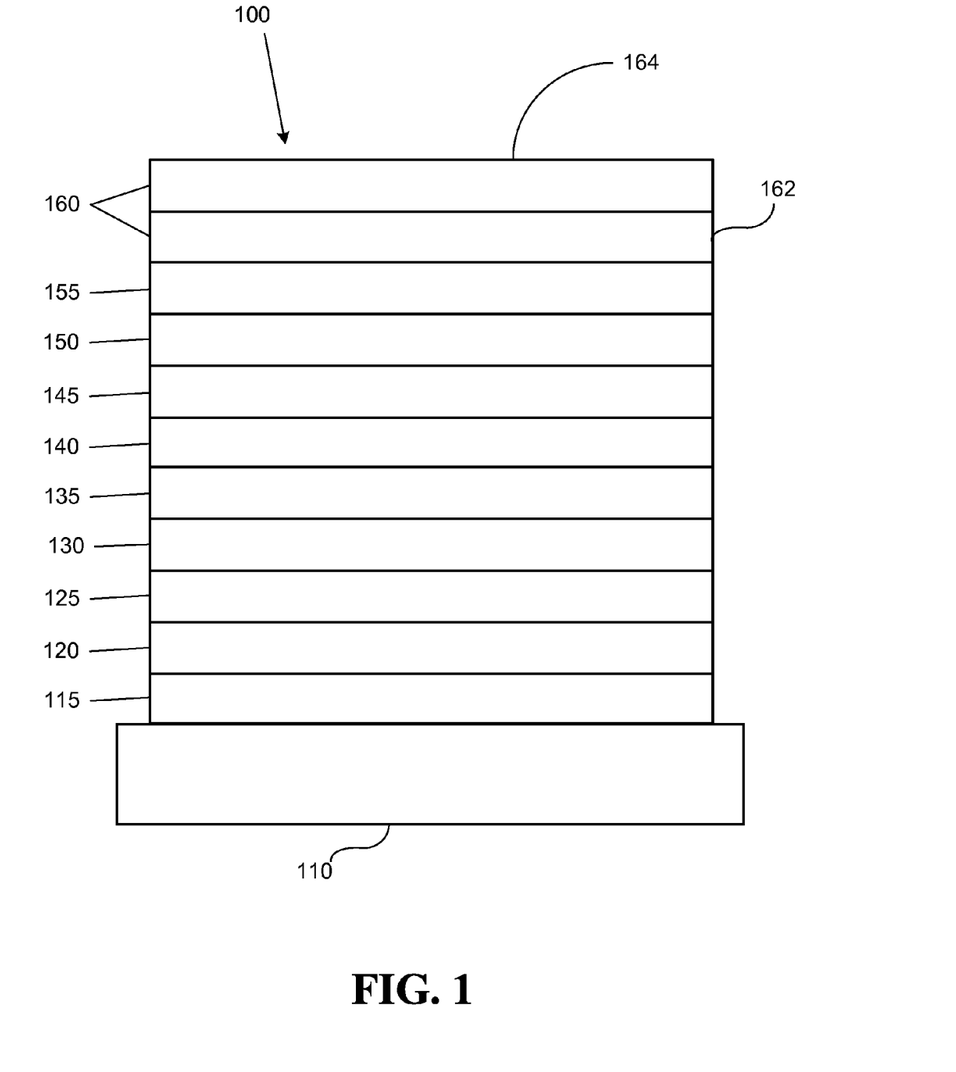
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F.sub.4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
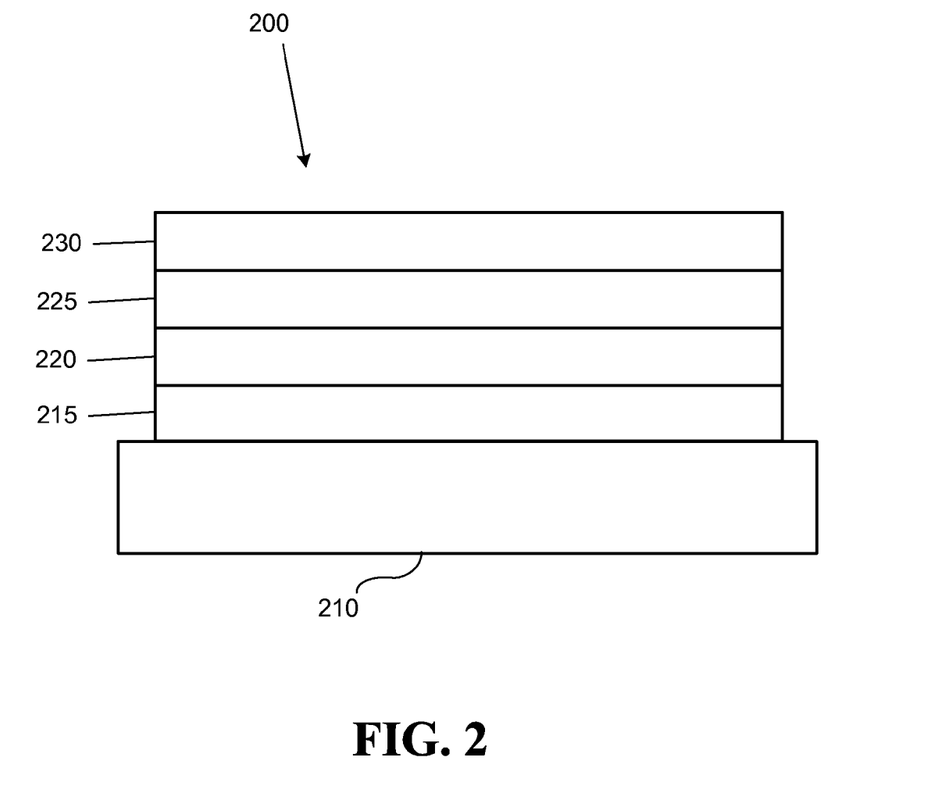
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

One application for organic emissive molecules is a full color display, preferably an active matrix OLED (AMOLED) display. One factor that currently limits AMOLED display lifetime and power consumption is the lack of a commercial blue OLED with saturated CIE coordinates with sufficient device lifetime.

Figure 3:
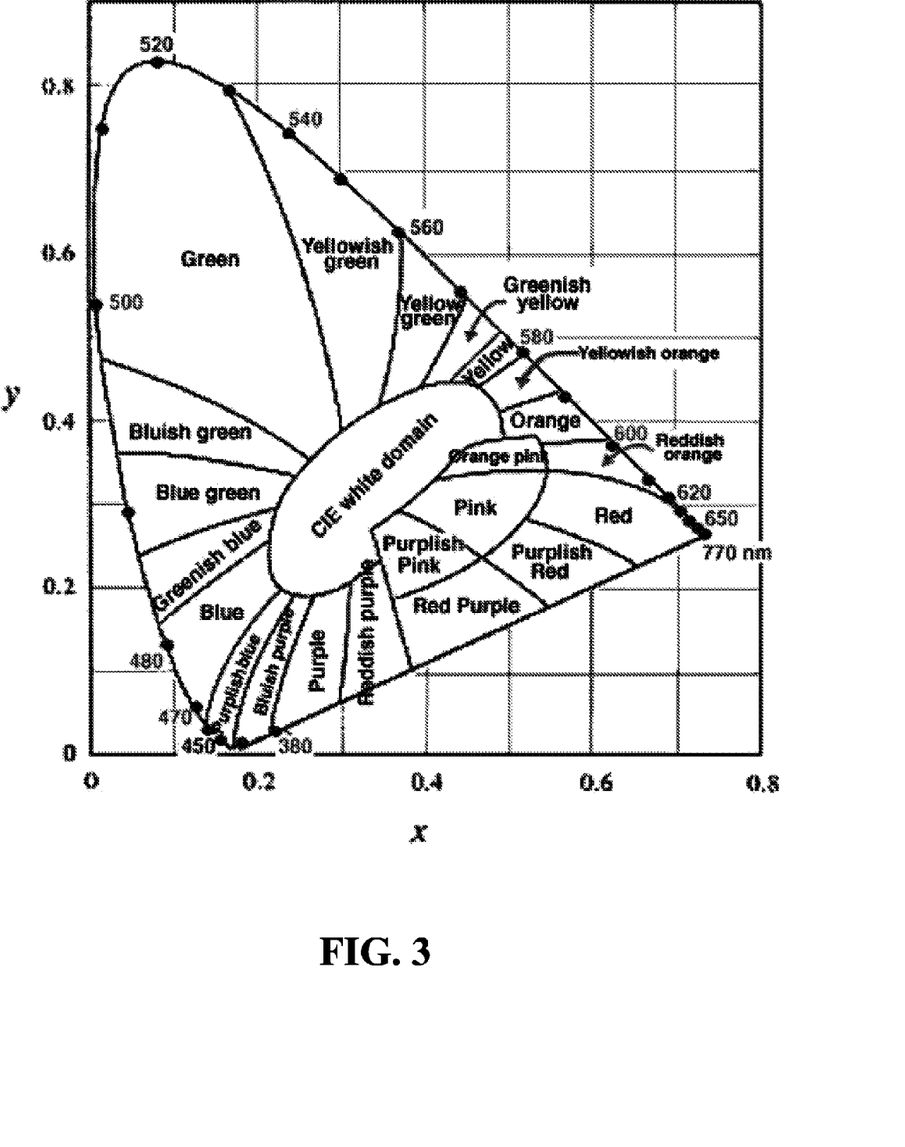
FIG. 3 shows a rendition of the 1931 CIE chromaticity diagram.

FIG. 3 shows the 1931 CIE chromaticity diagram, developed in 1931 by the International Commission on Illumination, usually known as the CIE for its French name Commission Internationale de l'Eclairage. Any color can be described by its x and y coordinates on this diagram. A "saturated" color, in the strictest sense, is a color having a point spectrum, which falls on the CIE diagram along the U-shaped curve running from blue through green to red. The numbers along this curve refer to the wavelength of the point spectrum. Lasers emit light having a point spectrum.

Figure 4:
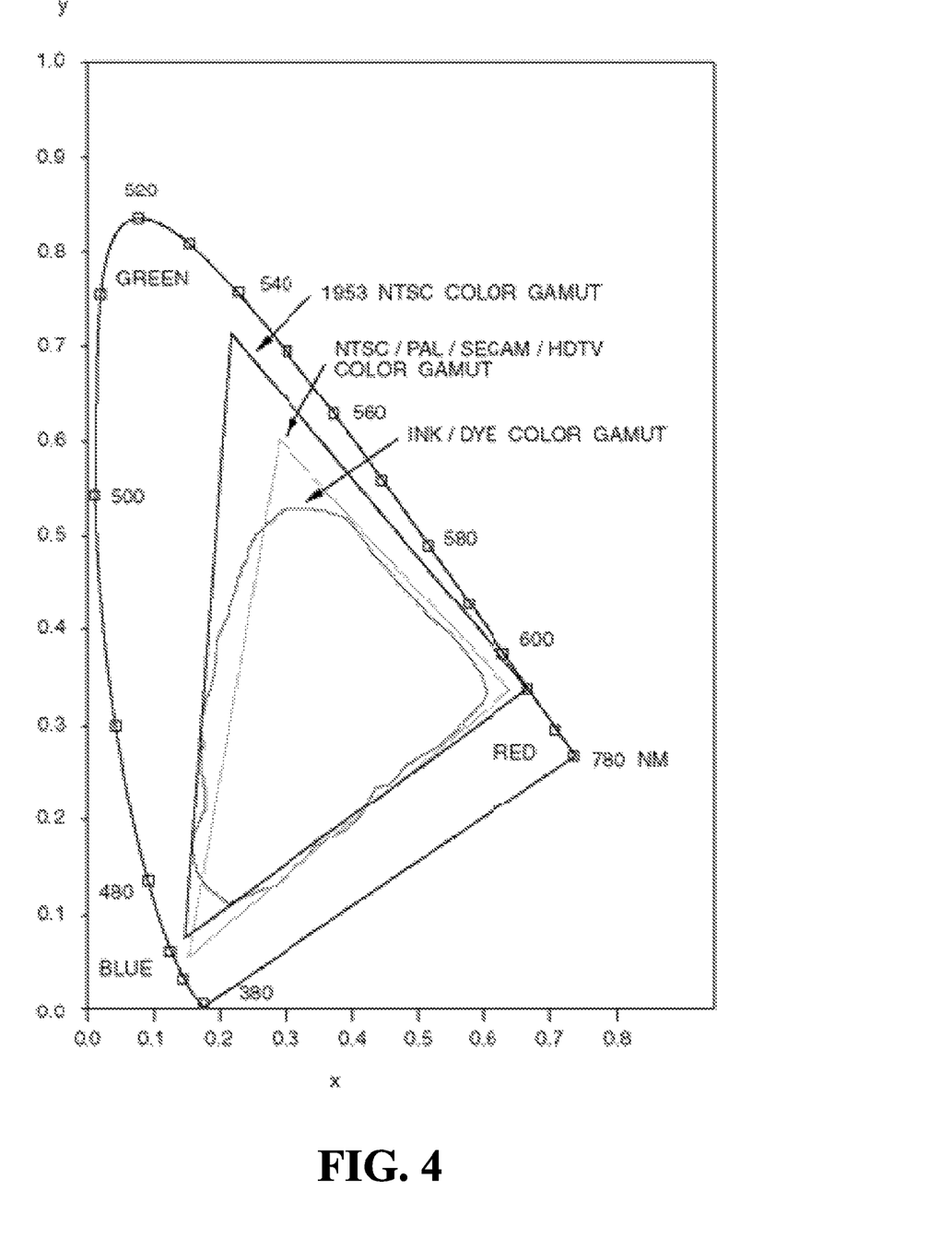
FIG. 4 shows a rendition of the 1931 CIE chromaticity diagram that also shows color gamuts.

FIG. 4 shows another rendition of the 1931 chromaticity diagram, which also shows several color "gamuts." A color gamut is a set of colors that may be rendered by a particular display or other means of rendering color. In general, any given light emitting device has an emission spectrum with a particular CIE coordinate. Emission from two devices can be combined in various intensities to render color having a CIE coordinate anywhere on the line between the CIE coordinates of the two devices. Emission from three devices can be combined in various intensities to render color having a CIE coordinate anywhere in the triangle defined by the respective coordinates of the three devices on the CIE diagram. The three points of each of the triangles in FIG. 4 represent industry standard CIE coordinates for displays. For example, the three points of the triangle labeled "NTSC/PAL/SECAM/HDTV gamut" represent the colors of red, green and blue (RGB) called for in the sub-pixels of a display that complies with the standards listed. A pixel having sub-pixels that emit the RGB colors called for can render any color inside the triangle by adjusting the intensity of emission from each sub-pixel.

The CIE coordinates called for by NTSC standards are: red (0.67, 0.33); green (0.21, 0.72); blue (0.14, 0.08). There are devices having suitable lifetime and efficiency properties that are close to the blue called for by industry standards, but remain far enough from the standard blue that the display fabricated with such devices instead of the standard blue would have noticeable shortcomings in rendering blues. The blue called for industry standards is a "deep" blue as defined below, and the colors emitted by efficient and long-lived blue devices are generally "light" blues as defined below.

A display is provided which allows for the use of a more stable and long lived light blue device, while still allowing for the rendition of colors that include a deep blue component. This is achieved by using a quad pixel, i.e., a pixel with four devices. Three of the devices are highly efficient and long-lived devices, emitting red, green and light blue light, respectively. The fourth device emits deep blue light, and may be less efficient or less long lived that the other devices. However, because many colors can be rendered without using the fourth device, its use can be limited such that the overall lifetime and efficiency of the display does not suffer much from its inclusion.

A display device or a region of a display is provided. The display region includes red, green, light blue, and deep blue-emitting devices, each of which may be configured as a sub-pixel within one or more pixels of the display region. A preferred use of the display region and devices that incorporate the display region is in an active matrix organic light emitting display, which is a type of device where the shortcomings of deep blue OLEDs are currently a limiting factor.

As used herein, "red" means having a peak wavelength in the visible spectrum of 580-700 nm, "green" means having a peak wavelength in the visible spectrum of 500-600 nm, "light blue" means having a peak wavelength in the visible spectrum of 400-500 nm, and "deep blue" means having a peak wavelength in the visible spectrum of 400-500 nm, where "light" and "deep" blue are distinguished by at least a 4 nm difference in peak wavelength. Preferably, the light blue device has a peak wavelength in the visible spectrum of 465-500 nm, and "deep blue" has a peak wavelength in the visible spectrum of 400-465 nm Preferred ranges include a peak wavelength in the visible spectrum of 610-640 nm for red and 510-550 nm for green.

Accordingly, as used herein, a "red" organic light emitting device or a "red-emitting" device is a device that emits "red" light as defined herein. "Green," "light blue," and "deep blue" devices, or "green-emitting," light blue emitting," and "deep blue-emitting" devices are those that emit "green," "light blue," or "deep blue" light as defined herein.

"Light blue" may be further defined, in addition to having a peak wavelength in the visible spectrum of 465-500 nm that is at least 4 nm greater than that of a deep blue OLED in the same device, as preferably having a CIE x-coordinate less than 0.2 and a CIE y-coordinate less than 0.5, and "deep blue" may be further defined, in addition to having a peak wavelength in the visible spectrum of 400-465 nm, as preferably having a CIE y-coordinate less than 0.15 and preferably less than 0.1, and the difference between the two may be further defined such that the CIE coordinates of light emitted by the third organic light emitting device and the CIE coordinates of light emitted by the fourth organic light emitting device are sufficiently different that the difference in the CIE x-coordinates plus the difference in the CIE y-coordinates is at least 0.01. As defined herein, the peak wavelength is the primary characteristic that defines light and deep blue, and the CIE coordinates are preferred.

More generally, "light blue" may mean having a peak wavelength in the visible spectrum of 400-500 nm, and "deep blue" may mean having a peak wavelength in the visible spectrum of 400-500 nm, and at least 4 nm less than the peak wavelength of the light blue.

In another embodiment, "light blue" may mean having a CIE y coordinate less than 0.25, and "deep blue" may mean having a CIE y coordinate at least 0.02 less than that of "light blue."

In another embodiment, the definitions for light and deep blue provided herein may be combined to reach a narrower definition. For example, any of the CIE definitions may be combined with any of the wavelength definitions. The reason for the various definitions is that wavelengths and CIE coordinates have different strengths and weaknesses when it comes to measuring color. For example, lower wavelengths normally correspond to deeper blue. But a very narrow spectrum having a peak at 472 may be considered "deep blue" when compared to another spectrum having a peak at 471 nm, but a significant tail in the spectrum at higher wavelengths. This scenario is best described using CIE coordinates. It is expected that, in view of available materials for OLEDs, that the wavelength-based definitions are well-suited for most situations. In any event, embodiments of the invention include two different blue pixels, however the difference in blue is measured.

The organic light emitting devices described herein each have an emissive layer that includes an organic material that emits light when an appropriate voltage is applied across the device. The emissive material in the red- and green-emitting organic light emitting devices is preferably a phosphorescent material. The emissive material in the light blue emitting organic light emitting device is a fluorescent material. The emissive material in the fourth organic light emitting device may be either a fluorescent material or a phosphorescent material. Preferably, the emissive material in the fourth organic light emitting device is a phosphorescent material.

"Red" and "green" phosphorescent devices having lifetimes and efficiencies suitable for use in a commercial display are well known and readily achievable, including devices that emit light sufficiently close to the various industry standard reds and greens for use in a display. Examples of such devices are provided in M. S. Weaver, V. Adamovich, B. D'Andrade, B. Ma, R. Kwong, and J. J. Brown, Proceedings of the International Display Manufacturing Conference, pp. 328-331 (2007); see also B. D'Andrade, M. S. Weaver, P. B. MacKenzie, H. Yamamoto, J. J. Brown, N.C. Giebink, S. R. Forrest and M. E. Thompson, Society for Information Display Digest of Technical Papers 34, 2, pp. 712-715 (2008).

An example of a light blue fluorescent device is provided in Jiun-Haw Lee, Yu-Hsuan Ho, Tien-Chin Lin and Chia-Fang Wu, Journal of the Electrochemical Society, 154 (7) J226-J228 (2007). The emissive layer comprises a 9,10-bis(2'-napthyl)anthracene (ADN) host and a 4,4'-bis[2-(4-(N,N-diphenylamino)phenyl)vinyl]biphenyl (DPAVBi) dopant. At 1,000 cd/m², a device with this emissive layer operates with 18.0 cd/A luminous efficiency and CIE 1931 (x, y)=(0.155, 0.238). Further example of blue fluorescent dopant are given in "Organic Electronics: Materials, Processing, Devices and Applications", Franky So, CRC Press, p 448-p 449 (2009). One particular example is dopant EK9, with 11 cd/A luminous efficiency and CIE 1931 (x, y)=(0.14, 0.19). Further examples are given in patent applications WO 2009/107596 A1 and US 2008/0203905. A particular example of an efficient fluorescent light blue system given in WO 2009/107596 A1 is dopant DM1-1' with host EM2', which gives 19 cd/A efficiency in a device operating at 1,000 cd/m².

An example of a light blue phosphorescent device has the structure:
ITO (80 nm)/LG101 (10 nm)/NPD (30 nm)/Compound A: Emitter A (30 nm:15%)/Compound A (5 nm)/Alq₃ (40 nm)/ LiF (1 nm)/Al (100 nm).
LG101 is available from LG Chem. Ltd. of Korea.

Compound A

Emitter A

Emitter B

Compound C

Such a device has been measured to have a lifetime of 3,000 hrs from initial luminance 1000 nits at constant dc current to 50% of initial luminance, 1931 CIE coordinates of CIE (0.175, 0.375), and a peak emission wavelength of 474 nm in the visible spectrum.

"Deep blue" devices are also readily achievable, but not necessarily having the lifetime and efficiency properties desired for a display suitable for consumer use. One way to achieve a deep blue device is by using a fluorescent emissive material that emits deep blue, but does not have the high efficiency of a phosphorescent device. An example of a deep blue fluorescent device is provided in Masakazu Funahashi et al., Society for Information Display Digest of Technical Papers 47. 3, pp. 709-711 (2008). Funahashi discloses a deep blue fluorescent device having CIE coordinates of (0.140, 0.133) and a peak wavelength of 460 nm. Another way is to use a phosphorescent device having a phosphorescent emissive material that emits light blue, and to adjust the spectrum of light emitted by the device through the use of filters or microcavities. Filters or microcavities can be used to achieve a deep blue device, as described in Baek-Woon Lee, Young In Hwang, Hae-Yeon Lee and Chi Woo Kim and Young-Gu Ju Society for Information Display Digest of Technical Papers 68.4, pp. 1050-1053 (2008), but there may be an associated decrease in device efficiency. Indeed, the same emitter may be used to fabricate a light blue and a deep blue device, due to microcavity differences. Another way is to use available deep blue phosphorescent emissive materials, such as described in United States Patent Publication 2005-0258433, which is incorporated by reference in its entirety and for compounds shown at pages 7-14. However, such devices may have lifetime issues. An example of a suitable deep blue device using a phosphorescent emitter has the structure:

ITO (80 nm)/Compound C (30 nm)/NPD (10 nm)/Compound A:Emitter B (30 nm:9%)/Compound A (5 nm)/Alq3 (30 nm)/LiF (1 nm)/Al (100 nm)

Such a device has been measured to have a lifetime of 600 hrs from initial luminance 1000 nits at constant dc current to 50% of initial luminance, 1931 CIE coordinates of CIE: (0.148, 0.191), and a peak emissive wavelength of 462 nm.

The difference in luminous efficiency and lifetime of deep blue and light blue devices may be significant. For example, the luminous efficiency of a deep blue fluorescent device may be less than 25% or less than 50% of that of a light blue fluorescent device. Similarly, the lifetime of a deep blue fluorescent device may be less than 25% or less than 50% of that of a light blue fluorescent device. A standard way to measure lifetime is $LT_{50}$ at an initial luminance of 1000 nits, i.e., the time required for the light output of a device to fall by 50% when run at a constant current that results in an initial luminance of 1000 nits. The luminous efficiency of a light blue fluorescent device is expected to be lower than the luminous efficiency of a light blue phosphorescent device, however, the operational lifetime of the fluorescent light blue device may be extended in comparison to available phosphorescent light blue devices.

Figure 5:
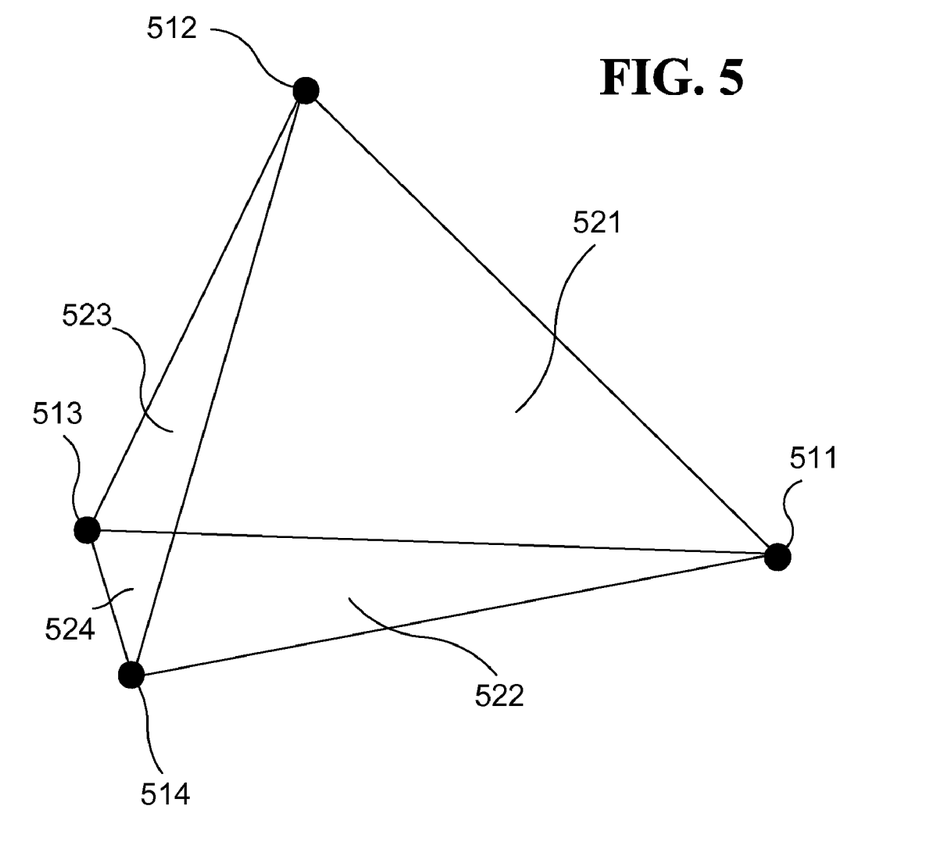
FIG. 5 shows CIE coordinates for various devices.

A device or pixel having four organic light emitting devices, one red, one green, one light blue and one deep blue, may be used to render any color inside the shape defined by the CIE coordinates of the light emitted by the devices on a CIE chromaticity diagram. FIG. 5 illustrates this point. FIG. 5 should be considered with reference to the CIE diagrams of FIGS. 3 and 4, but the actual CIE diagram is not shown in FIG. 5 to make the illustration clearer. In FIG. 5, point 511 represents the CIE coordinates of a red device, point 512 represents the CIE coordinates of a green device, point 513 represents the CIE coordinates of a light blue device, and point 514 represents the CIE coordinates of a deep blue device. The pixel may be used to render any color inside the quadrangle defined by points 511, 512, 513 and 514. If the CIE coordinates of points 511, 512, 513 and 514 correspond to, or at least encircle, the CIE coordinates of devices called for by a standard gamut—such as the corners of the triangles in FIG. 4—the device may be used to render any color in that gamut.

Many of the colors inside the quadrangle defined by points 511, 512, 513 and 514 can be rendered without using the deep blue device. Specifically, any color inside the triangle defined by points 511, 512 and 513 may be rendered without using the deep blue device. The deep blue device would only be needed for colors falling outside of this triangle. Depending upon the color content of the images in question, only minimal use of the deep blue device may be needed.

FIG. 5 shows a "light blue" device having CIE coordinates 513 that are outside the triangle defined by the CIE coordinates 511, 512 and 514 of the red, green and deep blue devices, respectively. Alternatively, the light blue device may have CIE coordinates that fall inside of said triangle.

A preferred way to operate a device having a red, green, light blue and deep blue device, or first, second, third and fourth devices, respectively, as described herein is to render a color using only 3 of the 4 devices at any one time, and to use the deep blue device only when it is needed. Referring to FIG. 5, points 511, 512 and 513 define a first triangle, which includes areas 521 and 523. Points 511, 512 and 514 define a second triangle, which includes areas 521 and 522. Points 512, 513 and 514 define a third triangle, which includes areas 523 and 524. If a desired color has CIE coordinates falling within this first triangle (areas 521 and 523), only the first, second and third devices are used to render the color. If a desired color has CIE coordinates falling within the second triangle, and does not also fall within the first triangle (area 522), only the first, second and fourth devices are used to render color. If a desired color has CIE coordinates falling within the third triangle, and does not fall within the first triangle (area 524), only the first, third and fourth, or only the second, third and fourth devices are used to render color.

Such a device could be operated in other ways as well. For example, all four devices could be used to render color. However, such use may not achieve the purpose of minimizing use of the deep blue device.

Algorithms have been developed in conjunction with RGBW (red, green, blue, white) devices that may be used to map a RGB color to an RGBW color. Similar algorithms may be used to map an RGB color to RG B1 B2. Such algorithms, and RGBW devices generally, are disclosed in A. Arnold, T. K. Hatwar, M. Hettel, P. Kane, M. Miller, M. Murdoch, J. Spindler, S. V. Slyke, Proc. Asia Display (2004); J. P. Spindler, T. K. Hatwar, M. E. Miller, A. D. Arnold, M. J. Murdoch, P. J. Lane, J. E. Ludwicki and S. V. Slyke, SID 2005 International Symposium Technical Digest 36, 1, pp. 36-39 (2005) ("Spindler"); Du-Zen Peng, Hsiang-Lun, Hsu and Ryuji Nishikawa. Information Display 23, 2, pp 12-18 (2007) ("Peng"); B-W. Lee, Y. I. Hwang, H-Y, Lee and C. H. Kim, SID 2008 International Symposium Technical Digest 39, 2, pp. 1050-1053 (2008). RGBW displays are significantly different from those disclosed herein because they still need a good deep blue device. Moreover, there is teaching that the "fourth" or white device of an RGBW display should have particular "white" CIE coordinates, see Spindler at 37 and Peng at 13.

Specific examples of devices, components, and materials, experimental data, and additional information about multi-device light emitting devices as described herein, as well as suitable materials and device structures for individual sub-pixels are provided in U.S. Patent Application Publication Nos. 2010/0225252, 2010/0090620, and 2010/0244069, and in International Application No. PCT/US 10/46218, the disclosure of each of which is incorporated by reference in its entirety.

Figure 6:
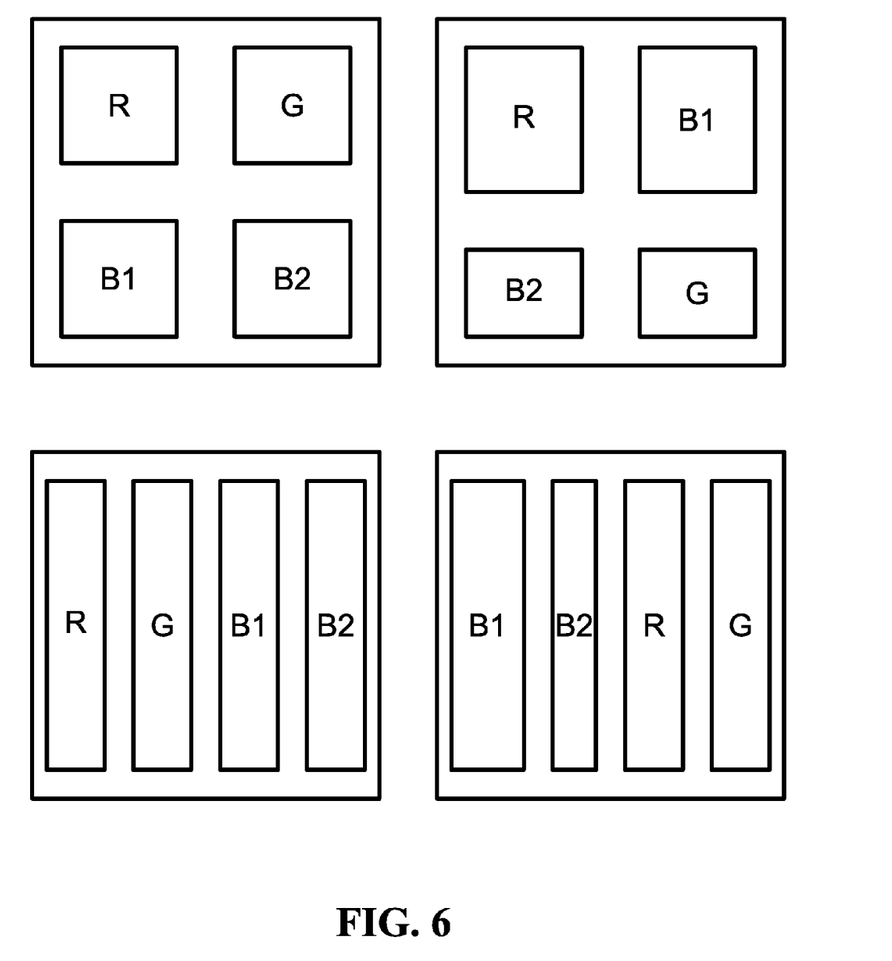
FIG. 6 shows various configurations for a pixel having four sub-pixels.

In devices that use four organic light emitting devices as sub-pixels, the devices may be arranged in various physical configurations. For example, the sub-pixel devices may be arranged in a quad configuration, and the devices may have equal or different surface areas. FIG. 6 illustrates examples of these configurations. In FIG. 6, R is a red-emitting device, G is a green-emitting device, B1 is a light blue emitting device, and B2 is a deep blue emitting device. Further examples of such configurations described in U.S. Pub. No. 2010/0225252, the disclosure of each of which is incorporated by reference in its entirety.

Other configurations may be used. In general, as used herein a pixel is defined by four devices: a red-emitting device, a green-emitting device, a light blue-emitting device and a deep blue-emitting device. Each device or sub-pixel need not be uniquely used in a single pixel. Rather, as described in further detail below, other configurations include those where one or more organic light emitting devices are shared between multiple pixels. For example, a deep blue-emitting device may be used in two pixels, each of which otherwise uses separate red, green and light blue devices as sub-pixels.

Generally, a four sub-pixel display region has a 1/4 aperture ratio, compared to a 1/3 aperture ratio in a conventional three sub-pixel (RGB) display. In configurations using a quad or generally quad arrangement, such as those described in PCT/US10/46218, it has been found that the deep blue component (B2) is used less than the other sub-pixels. Thus, using an arrangement in which two or more multiple pixels share a common deep blue device provides a higher aperture ratio to the other sub-pixels used in each pixel within a display region. In other configurations, the most efficient sub-pixel, typically the green device, also may be shared by two or more pixels, resulting in the same or a comparable aperture ratio as in a conventional three sub-pixel device, without sacrificing power efficiency and/or a relatively long operational lifetime.

Some AMLCD devices make use of configurations in which there are fewer blue sub-pixels or pixels than red or green, while using a larger surface area for each blue device. In contrast, configurations described herein make use of display regions having fewer deep blue than red, green, and/or deep blue devices, such that the density of deep blue devices is less than the density of other devices. Because these configurations make use of both light blue and deep blue devices, the overall density of blue devices may remain the same because one or both of the light blue and deep blue devices can contribute to each pixel as a blue sub-pixel. That is, in configurations in which no devices are shared the density of light blue by number of devices may be less than red and green devices, but higher or the same density as deep blue devices; in configurations described herein where blue devices are shared, the density of deep blue typically is less than the density of light blue, green, and red devices.

Figure 7A:
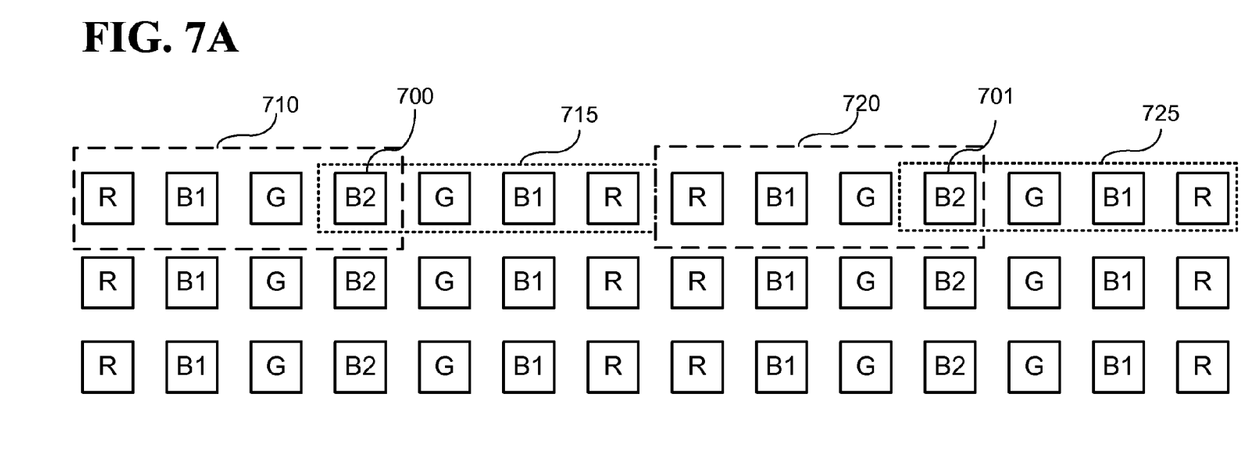
FIG. 7A shows an example configuration of a device in which deep blue sub-pixels are shared between two adjacent pixels.

FIG. 7A shows an example configuration of a device, such as a display region, in which deep blue sub-pixels are shared between two adjacent pixels. As with FIG. 6, in FIGS. 7-8, R indicates a red-emitting device, G indicates a green-emitting device, B1 indicates a light blue-emitting device, and B2 indicates a deep blue-emitting device. Individually-addressable pixels are indicated by dashed and/or dotted lines. Each pixel 710, 715, 720, 725 includes a single R, G, B1, and B2 (red, green, light blue, and deep blue, respectively) sub-pixel. Each pixel 710, 715, 720, 725 may be described as "defined by" the sub-pixels that make up the pixel. Physically, the sub-pixels may be addressable or otherwise controllable as a single pixel. Further, adjacent pixels share a common deep blue pixel. For example, each of the pixels 710, 715 is defined by the deep blue device 700 in conjunction with a separate set of a red, green, and light blue devices that are unique to each pixel 710, 715. Similarly, the pixels 720, 725 share a deep blue device 701. This arrangement increases the aperture ratio from 25% to 28.6% compared to quad-pixel arrangements in which no devices are share between multiple pixels. An additional benefit may be achieved by separating the light and deep blue devices as shown, i.e., so that no light blue devices are immediately adjacent to a deep blue device. This can increase the spatial Nyquist limits of the display device, which effect is described in L. D. Silverstein, S. J. Roosendall, and M. J. J. Jak, Journal of the Society for Information Display 14, 3-13 (2006).

Figure 7B:
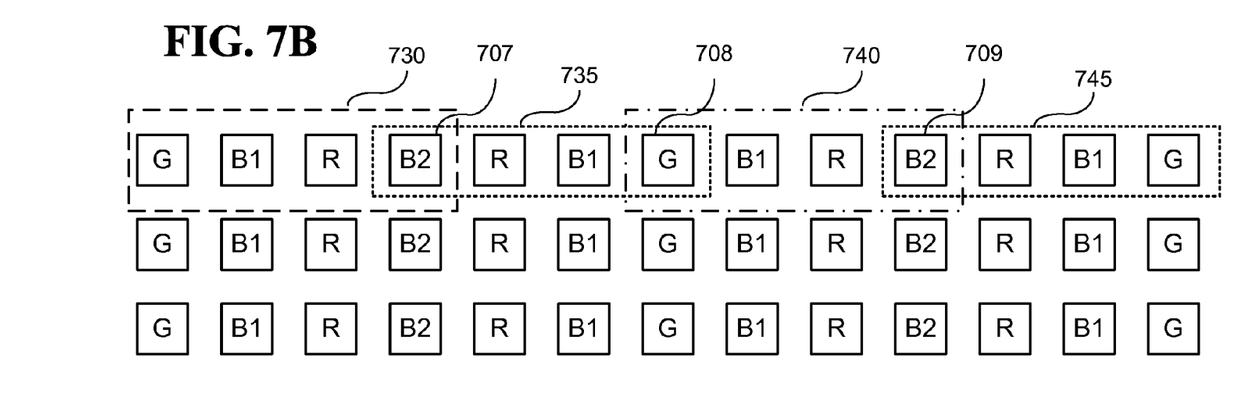
FIG. 7B shows an example configuration of a device such as a display region in which the deep blue and green pixels are shared by adjacent pixels.

FIG. 7B shows an example configuration of a device such as a display region in which deep blue and green devices are shared by adjacent pixels. In the example, pixels 730, 735 share a deep blue device 707. Pixels 735, 740 share a green device 708, and pixels 740 and 745 share a deep blue device 709. For illustration purposes it is presumed that the green device is the most efficient, but it will be understood that equivalent arrangements and device structures may be obtained by sharing red devices as well. By sharing the most efficient device as well as the deep blue device between multiple pixels, an aperture ratio of up to 1/3 may be achieved, equivalent to a conventional RGB display. Further, as with arrangements such as that shown in FIG. 7A, separating the light and deep blue devices may increase the spatial Nyquist limits of the device.

Figure 7C:
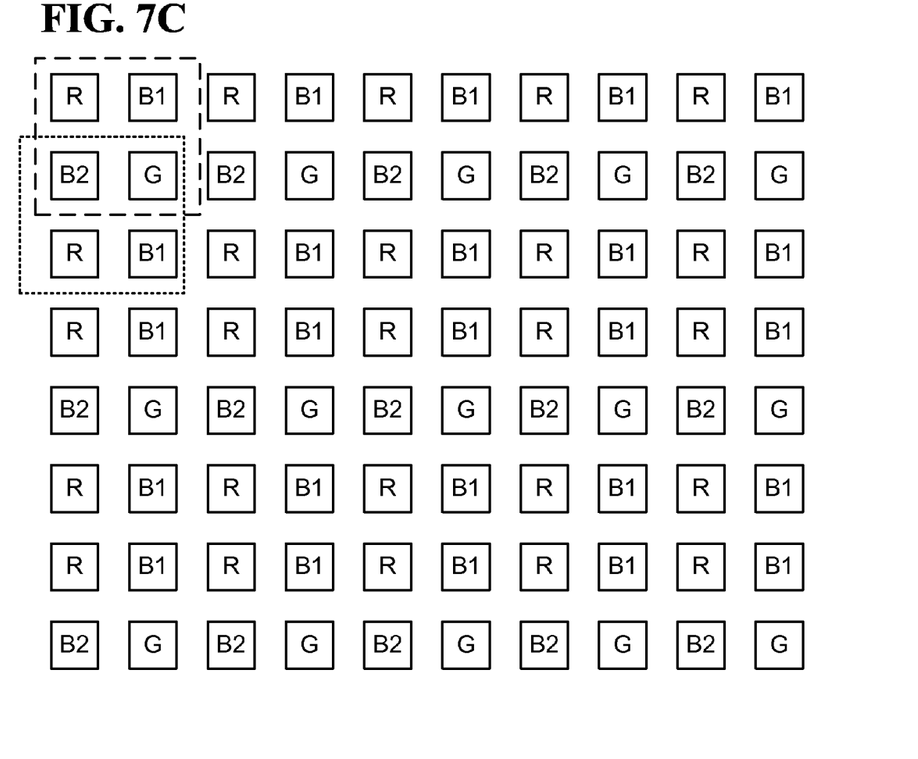
FIG. 7C shows an example configuration in which deep blue and green devices are shared vertically across adjacent rows.

FIG. 7C shows an example configuration in which deep blue and green devices are shared vertically across adjacent rows. As in FIGS. 7A and 7B, FIG. 7C indicates example pixels with dotted outlines, which arrangement may be repeated across the display region as will be understood by one of skill in the art. The example configuration in FIG. 7B may provide the same benefits and features as described with respect to FIG. 7B.

Figure 8:
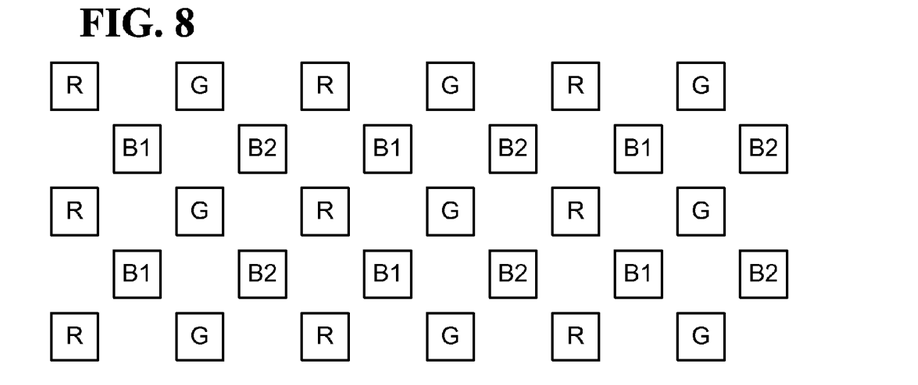
FIG. 8 shows an example configuration of a device in which pixels include red, green, and light blue devices arranged in a triangular configuration.

Configurations such as those shown in FIGS. 7A-7C may be referred to as row-based, and the devices of each pixel may be described as being arranged in a row. Other arrangements may be used. For example, the red, green, and light blue devices may be arranged in a triangular configuration, which generally may result in a better picture quality when used in a full-color display, due to the closer packing that results. FIG. 8 shows an example of a configuration in which pixels include red, green, and light blue devices arranged in a triangular or delta configuration. Generally, this and other similar arrangements may be used to increase the fill factor and aperture ratio of a device. Similar arrangements may be used for display regions as described herein, which may include fewer deep blue devices relative to the other types, and share deep blue devices between adjacent pixels as described herein. The types of arrangement illustrated in FIG. 8 may be referred to as a triangular arrangement, in contrast to the row-based arrangements of FIGS. 7A-7C in which each complete pixel is arranged linearly within a single row of the display device.

Figure 9:
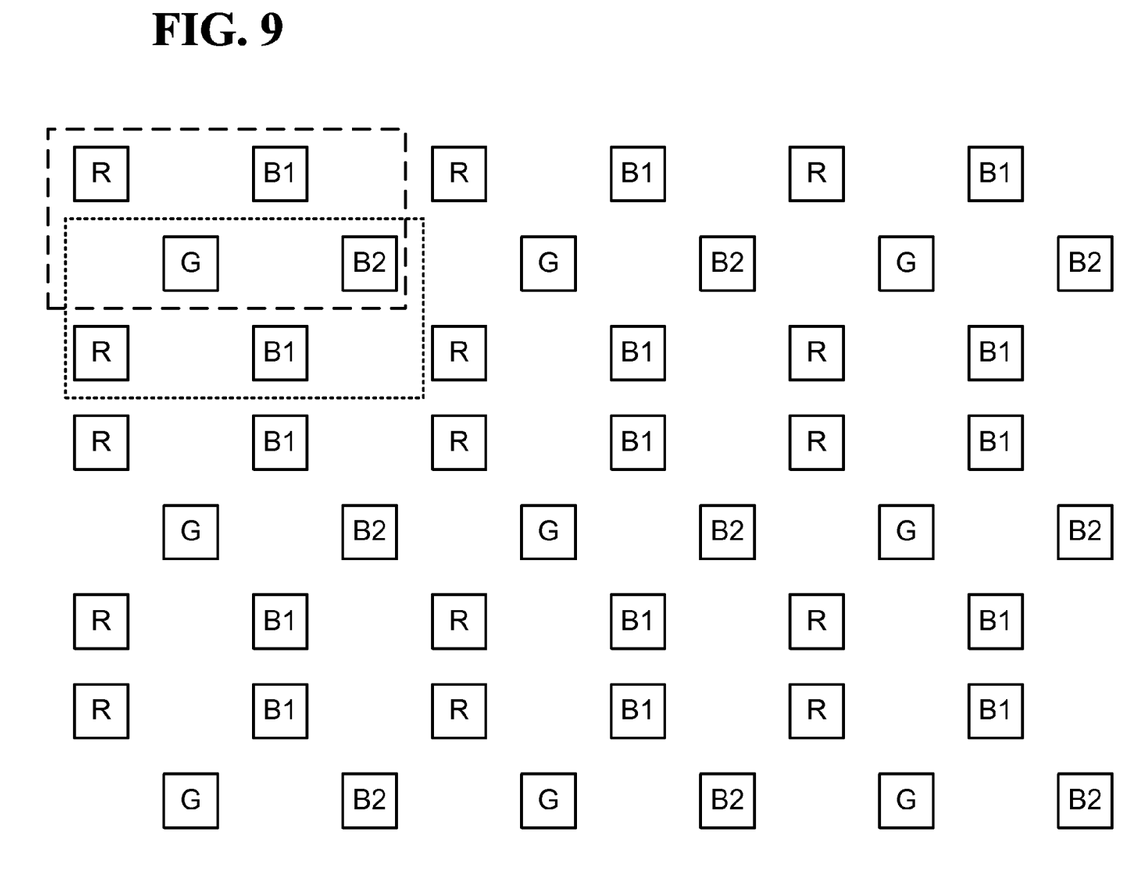
FIG. 9 shows an example delta pattern configuration in which deep blue and green pixels are shared between adjacent pixels.

Variations of the specific arrangements shown may be used, such as where each row of devices is offset by a set amount from the previous row, i.e., the row above it, such that a red device may be adjacent to a blue and/or green device in an adjacent row instead of two red devices as illustrated. Each row may include the same order of devices, for example R-B1-G-B2-G-B1-R as shown in FIG. 7A, or the order of devices in different rows may vary to allow for closer device arrangement, more efficient electrical connections, or other advantages. Other configurations may be used. For example, FIG. 9, shows a triangular configuration in which rows and/or devices may be offset to allow for higher packing ratios, i.e., relative coverage by emissive devices, while still sharing deep blue devices between adjacent pixels. In FIG. 9, both deep blue and green devices are shared between adjacent pixels. Similar arrangements in which only deep blue devices are shared also may be used. Other types of sub-pixel arrangements may be used, such as those shown in U.S. Pat. No. 7,091,986.

In general, a device such as a region of a display is provided, which has multiple independently-addressable pixels, each pixel capable of emitting a spectrum. The spectrum each device can emit includes a red component having a peak wavelength in the visible spectrum of 580-700 nm, a green component having a peak wavelength in the visible spectrum of 500-600 nm, a light blue component having a peak wavelength in the visible spectrum of 400-500 nm, and a deep blue component having a peak wavelength in the visible spectrum of 400-500 nm and at least 4 nm less than the peak wavelength of the light blue component. Two of the pixels share at least one organic light emitting device, and at least one of the two includes a first red-emitting organic light emitting device configured to emit light having a peak wavelength in the visible spectrum of 580-700 nm, a first green-emitting organic light emitting device configured to emit light having a peak wavelength in the visible spectrum of 500-600 nm, a first light blue-emitting organic light emitting device configured to emit light having a peak wavelength in the visible spectrum of 400-500 nm, and a first deep blue-emitting organic light emitting device configured to emit light having a peak wavelength in the visible spectrum of 400-500 nm and at least 4 nm less than the peak wavelength of the first light blue organic light emitting device. In general, each device may emit the corresponding portion of the spectrum that the pixel emits.

The deep blue device may be shared with a second pixel. In such a configuration, the second pixel includes a second red-emitting organic light emitting device configured to emit light having a peak wavelength in the visible spectrum of 580-700 nm, a second green-emitting organic light emitting device configured to emit light having a peak wavelength in the visible spectrum of 500-600 nm, a second light blue-emitting organic light emitting device configured to emit light having a peak wavelength in the visible spectrum of 400-500 nm, the first deep blue-emitting organic light emitting device.

A high-efficiency device, typically the green-emitting device, also may be shared between two pixels. In such a configuration, the second pixel includes a second red-emitting organic light emitting device configured to emit light having a peak wavelength in the visible spectrum of 580-700 nm, the first green-emitting organic light emitting device, a second light blue-emitting organic light emitting device configured to emit light having a peak wavelength in the visible spectrum of 400-500 nm, and the first deep blue-emitting organic light emitting device.

As shown in FIGS. 7-8, a limited number of device types, typically red, green, light blue, and dark blue, may be used. In configurations where one or more device types are shared between multiple pixels, one or more types make up less than 25%, less than 17%, or less than 15% of the total number of devices in the device or display region. For example, in configurations such as that illustrated in FIG. 7A where deep blue-emitting devices are shared by multiple pixels, the deep blue devices may make up less than about 15% of the total number of devices in a given region of the device. These ratios may apply for an arbitrary region of a display device, for example a region including 100, 1000, or more pixels.

The provided device or display region may be incorporated into various other devices and types of devices, such as consumer products, including full-color displays and devices that include full-color displays.

The use of four sub-pixel configurations as described herein may allow for an enhanced fill factor relative to traditional three sub-pixel devices, especially when a less-used sub-pixel is shared between two or more adjacent pixels. In those configurations, the other sub-pixels may make up a relatively larger portion of each pixel. It is expected that deep blue and/or highly-efficient sub-pixels will achieve particularly improved performance when shared by multiple pixels. The human eye has a lower sensitivity or resolution for deep blue colors, so the use of fewer deep blue sub-pixels can allow for an overall increase in the relative size of the other sub-pixels without a discernible loss of resolution or color.

Four sub-pixel devices also may achieve longer operations lifetimes by reducing the overall current density within each pixel or display region due to the higher aperture ratio achieved with four sub-pixel devices.

Various types of OLEDs may be used to implement various configurations, including transparent OLEDs and flexible OLEDs.

Displays with devices having four sub-pixels, in any of the various configurations illustrated and in other configurations, may be fabricated and patterned using any of a number of conventional techniques. Examples include shadow mask, laser induced thermal imaging (LITI), ink-jet printing, organic vapor jet printing (OVJP), or other OLED patterning technology. An extra masking or patterning step may be needed for the emissive layer of the fourth device, which may increase fabrication time. The material cost may also be somewhat higher than for a conventional display. These additional costs would be offset by improved display performance.

A single pixel may incorporate more than the four sub-pixels disclosed herein, possibly with more than four discrete colors. However, due to manufacturing concerns, four sub-pixels per pixel is preferred.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:
1. A region of a display having a plurality of independently-addressable pixels, each pixel capable of emitting a spectrum comprising:
 a red component having a peak wavelength in the visible spectrum of 580-700 nm;
 a green component having a peak wavelength in the visible spectrum of 500-600 nm;
 a light blue component having a peak wavelength in the visible spectrum of 400-500 nm; and
 a deep blue component having a peak wavelength in the visible spectrum of 400-500 nm and at least 4 nm less than the peak wavelength of the light blue component;
 wherein a first of the plurality of pixels and a second of the plurality of pixels share at least one organic light emitting device; and
 wherein the first pixel comprises:
  a first red-emitting organic light emitting device configured to emit light having a peak wavelength in the visible spectrum of 580-700 nm,
  a first green-emitting organic light emitting device configured to emit light having a peak wavelength in the visible spectrum of 500-600 nm;
  a first light blue-emitting organic light emitting device configured to emit light having a peak wavelength in the visible spectrum of 400-500 nm;
  a first deep blue-emitting organic light emitting device configured to emit light having a peak wavelength in the visible spectrum of 400-500 nm and at least 4 nm less than the peak wavelength of the first light blue organic light emitting device.

2. The display region of claim 1, wherein the second pixel comprises:
   a second red-emitting organic light emitting device configured to emit light having a peak wavelength in the visible spectrum of 580-700 nm;
   a second green-emitting organic light emitting device configured to emit light having a peak wavelength in the visible spectrum of 500-600 nm;
   a second light blue-emitting organic light emitting device configured to emit light having a peak wavelength in the visible spectrum of 400-500 nm; and
   the first deep blue-emitting organic light emitting device.

3. The display region of claim 1, wherein the second pixel comprises:
   a second red-emitting organic light emitting device configured to emit light having a peak wavelength in the visible spectrum of 580-700 nm;
   the first green-emitting organic light emitting device;
   a second light blue-emitting organic light emitting device configured to emit light having a peak wavelength in the visible spectrum of 400-500 nm; and
   the first deep blue-emitting organic light emitting device.

4. The display region of claim 1, wherein the region contains exactly four types of devices, and at least one type of device comprises less than 25% of the total number of devices in the region.

5. The display region of claim 4, wherein the one of the types of devices comprises at most about 17% of the total number of devices in the region.

6. The display region of claim 5, wherein the one of the types of devices comprises at most about 15% of the total number of devices in the region.

7. The display region of claim 4, wherein the region includes at least 100 individually-addressable pixels.

8. The display region of claim 1, wherein the organic light emitting devices are arranged in a delta pattern.

9. The display region of claim 1, wherein no light blue-emitting organic light emitting device in the region is immediately adjacent to a deep blue-emitting organic light emitting device.

10. The display region of claim 1, wherein at least one light blue-emitting organic light emitting device in the region is immediately adjacent to a deep blue-emitting organic light emitting device.

11. The display region of claim 1, wherein each light blue-emitting organic light emitting device emits light having a peak wavelength in the visible spectrum of 465-500 nm.

12. The display region of claim 1, wherein each deep blue-emitting organic light emitting device emits light having a peak wavelength in the visible spectrum of 400-465 nm.

13. The display region of claim 1, wherein each light blue-emitting organic light emitting device emits light having a CIE x-coordinate less than 0.2 and a CIE y-coordinate of less than 0.5.

14. The display region of claim 13, wherein each deep blue-emitting organic light emitting device emits light having a CIE y-coordinate of less than 0.15.

15. The display region of claim 14, wherein the CIE coordinates of light emitted each light blue-emitting organic light emitting device and the CIE coordinates of light emitted by each deep blue-emitting organic light emitting device are sufficiently different that the difference in the CIE x-coordinates plus the difference in the CIE y-coordinates is at least 0.01.

16. The display region of claim 1, wherein the first red-emitting, green-emitting, and light blue-emitting organic light emitting devices are disposed in a triangular arrangement.

17. The display region of claim 1, wherein the first deep-blue, and the second red-emitting and green-emitting organic light emitting devices are disposed in a triangular arrangement.

18. The display region of claim 1, wherein the organic first red-emitting, green-emitting, light blue-emitting, and deep blue-emitting light emitting devices are arranged in a row.

19. The display region of claim 1, wherein the at least one of the first red-emitting, green-emitting, light blue-emitting, and deep blue-emitting organic light emitting device comprises an emissive layer having a fluorescent emissive material.

20. The display region of claim 1, wherein the at least one of the first red-emitting, green-emitting, light blue-emitting, and deep blue-emitting organic light emitting device comprises an emissive layer having a phosphorescent emissive material.

21. A full-color display comprising the display region of claim 1.

22. A consumer product comprising the display region of claim 1.

* * * * *